United States Patent
Sako et al.

(10) Patent No.: US 7,233,267 B2
(45) Date of Patent: Jun. 19, 2007

(54) DIGITAL DATA RECORDING MEDIUM, RECORDING METHOD, RECORDING DEVICE, REPRODUCTION METHOD, AND REPRODUCTION DEVICE

(75) Inventors: Yoichiro Sako, Tokyo (JP); Tatsuya Inokuchi, Tokyo (JP); Takashi Kihara, Chiba (JP); Shunsuke Furukawa, Tokyo (JP); Yoriaki Kanada, Kanagawa (JP); Akiya Saito, Kanagawa (JP); Toru Aida, Kanagawa (JP); Tatsushi Sano, Kanagawa (JP); Toshihiko Senno, Kanagawa (JP); Yoshinobu Usui, Kanagawa (JP)

(73) Assignees: Sony Corporation, Tokyo (JP); Sony Disc & Digital Solutions Inc., Tokyo (JP)

( * ) Notice: Subject to any disclaimer, the term of this patent is extended or adjusted under 35 U.S.C. 154(b) by 502 days.

(21) Appl. No.: 10/482,291

(22) PCT Filed: May 2, 2003

(86) PCT No.: PCT/JP03/05616

§ 371 (c)(1),
(2), (4) Date: Dec. 30, 2003

(87) PCT Pub. No.: WO03/094166

PCT Pub. Date: Nov. 13, 2003

(65) Prior Publication Data
US 2004/0165511 A1   Aug. 26, 2004

(30) Foreign Application Priority Data
May 2, 2002   (JP) .............................. 2002-130431

(51) Int. Cl.
H03M 5/00   (2006.01)
(52) U.S. Cl. .......................................... 341/58; 341/94
(58) Field of Classification Search .................. 341/59, 341/67, 65, 58, 50, 94; 714/762
See application file for complete search history.

(56) References Cited

U.S. PATENT DOCUMENTS 6,105,159 A * 8/2000 Frederickson ............... 714/762
6,708,104 B2 * 3/2004 Avery et al. ................. 701/110
7,030,788 B2 * 4/2006 Aida et al. ..................... 341/59

FOREIGN PATENT DOCUMENTS

| JP | 62-239479 | 10/1987 |
| JP | 9-288864 | 11/1997 |
| JP | 2000-106668 | 4/2000 |
| JP | 2002-329367 | 11/2002 |

* cited by examiner

Primary Examiner—Peguy JeanPierre
(74) Attorney, Agent, or Firm—Oblon, Spivak, McClelland, Maier & Neustadt, P.C.

(57) ABSTRACT

A recording method, wherein, when a certain portion of main data is recorded by being encoded by a first encoding method and the other portions of the main data is recorded by being encoded by a second encoding method, an encoding process is performed by the first encoding method so that, when data which is recorded in such a manner that the data encoded by the first encoding method is decoded by a decoding method corresponding to the first encoding method, and thereafter, is further encoded by the second encoding method, is decoded by a decoding method corresponding to the second encoding method, the sum value of DC components per unit time increases.

22 Claims, 7 Drawing Sheets

DIGITAL DATA RECORDING MEDIUM, RECORDING METHOD, RECORDING DEVICE, REPRODUCTION METHOD, AND REPRODUCTION DEVICE

TECHNICAL FIELD

The present invention relates to a digital data recording medium, recording method, recording device, playback method, and playback device.

BACKGROUND ART

Since CDs (Compact Discs) are easy to manufacture, are inexpensive, and are also easy to handle, they are widely used as recording media for storing various kinds of data such as digital audio data and image data, and computer programs.

In recent years, as the performance of personal computers-has improved and CD-R (CD Recordable) discs that enable additional recording and CD-RW (CD ReWritable) discs that enable data to be rewritten have appeared, the current situation is that digital data recorded on a CD can be easily copied onto such CD-R discs and CD-RW discs. Copying onto CD-R discs, etc., in this manner is generally illegal copying in which copyright is ignored. Therefore, the protection of digital data which is stored on a CD is required.

In view of the above, the present invention aims to enable an original CD to be distinguished from a copied CD, and aims to prevent a copied CD from being played back or read. In the following descriptions, it is assumed that CDs include CD-DA (CD Digital Audio) discs and CD-ROM discs.

DISCLOSURE OF THE INVENTION

The present invention provides a recording method, wherein, when a certain portion of main data is recorded by being encoded by a first encoding method and the other portions of the main data is recorded by being encoded by a second encoding method, an encoding process is performed by the first encoding method so that, when data which is recorded in such a manner that the data encoded by the first encoding method is decoded by a decoding method corresponding to the first encoding method, and thereafter, is further encoded by the second encoding method, is decoded by a decoding method corresponding to the second encoding method, the sum value of DC components per unit time increases.

Therefore, in copied articles, all data is encoded by the second encoding process.

BEST MODE FOR CARRYING OUT THE INVENTION

The present invention will now be described below in detail with reference to the drawings.

① Error Correction Code in a CD

Figure 1:
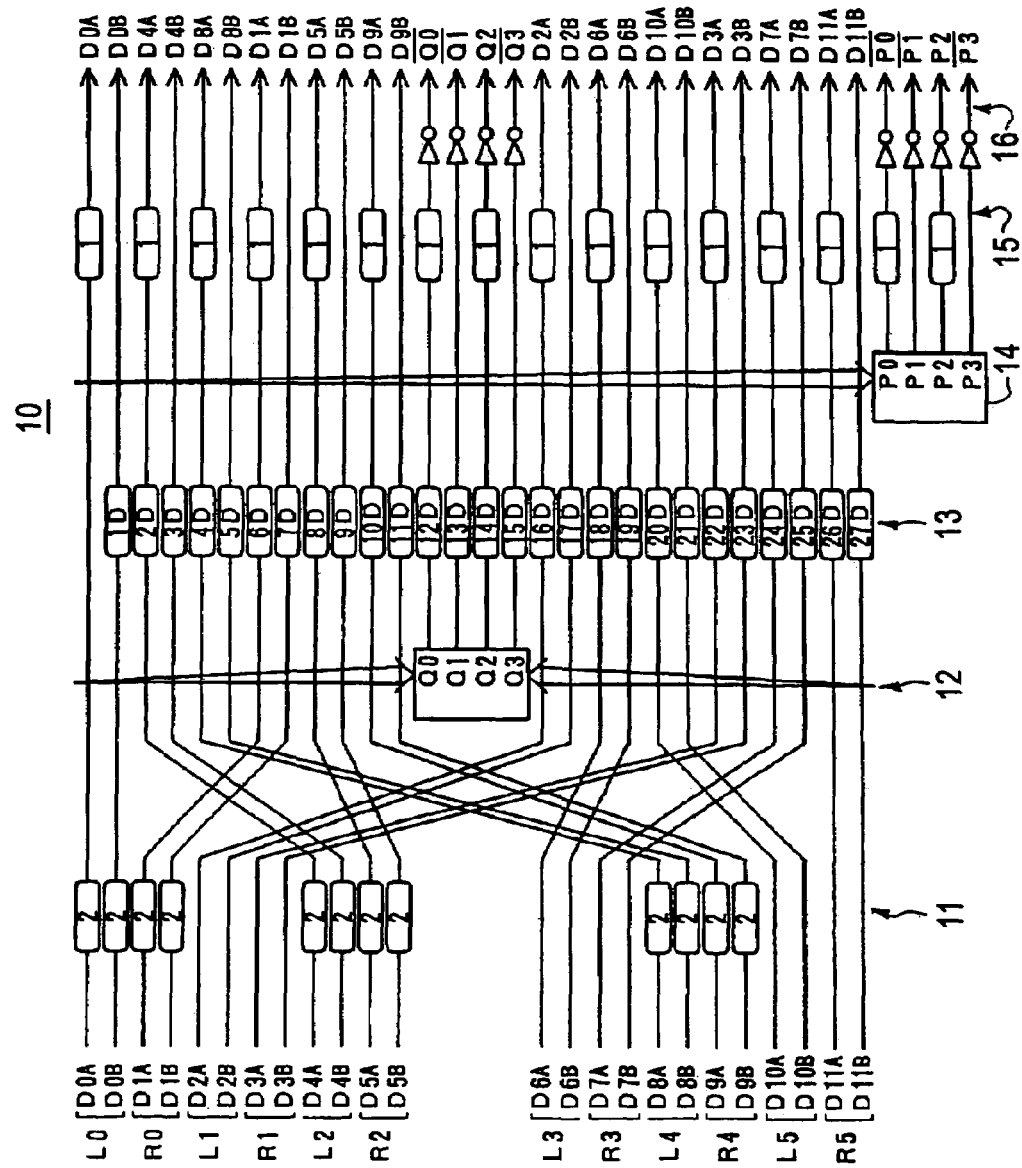
FIG. 1 is a system diagram illustrating the present invention.

The error correction coding adopted in current CDs as recording media is called a CIRC (Cross Interleave Reed-Solomon Code) method. FIG. 1 shows a CIRC encoder circuit 10 used in the recording system thereof. That is, in the CD, digital audio data L0 to L5 of six continuous samples from the left channel and digital audio data R0 to R5 from the corresponding six samples of the right channel form one frame. The data L0 to L5 and R0 to R5 are each 16 bits long, the data is divided into the higher-order eight bits D0A to D11A and the lower-order eight bits D0B to D11B, and each of the eight bits D0A to D11B is called a symbol.

These symbols D0A to D11B are supplied to a delay/scramble circuit 11, the symbol of an even-numbered sample is delayed by two symbols, and all the symbols are scrambled. The resulting output is supplied to a C2 encoder circuit 12, whereby (28,24,5) Reed-Solomon codes on the GF $(2^8)$ are coded, and thus, Q parities Q0 to Q3 of four symbols are generated. The output from the C2 encoder circuit 12 is supplied to an interleave circuit 13, whereby, if the amount of unit delay is denoted as D, a delay of 0, D, 2D, . . . , 27D, which differ equally, is supplied to each symbol. In current CDs, D is set at 4 frames, and the adjacent symbols are set apart in units of 4 frames. Hereinafter, the CIRC method when D=4 will be referred to as a "CIRC4 method".

Then, the output of the interleave circuit 13 is supplied to a C1 encoder circuit 14, whereby (32,28,5) Reed-Solomon codes on the GF $(2^8)$ are coded, and thus, P parities P0 to P3 of four symbols are generated. The output of the C1 encoder circuit 14 is supplied to a delay circuit 15, whereby every other symbol is delayed by one symbol. Also, the Q parities Q0 to Q3 and the P parities P0 to P3 are inverted by an inverter circuit 16, and these are output as encoded signals of the encoder circuit 10. These encoded signals are supplied to an EFM modulation circuit, and the EFM modulation signals are recorded on a CD.

Figure 2:
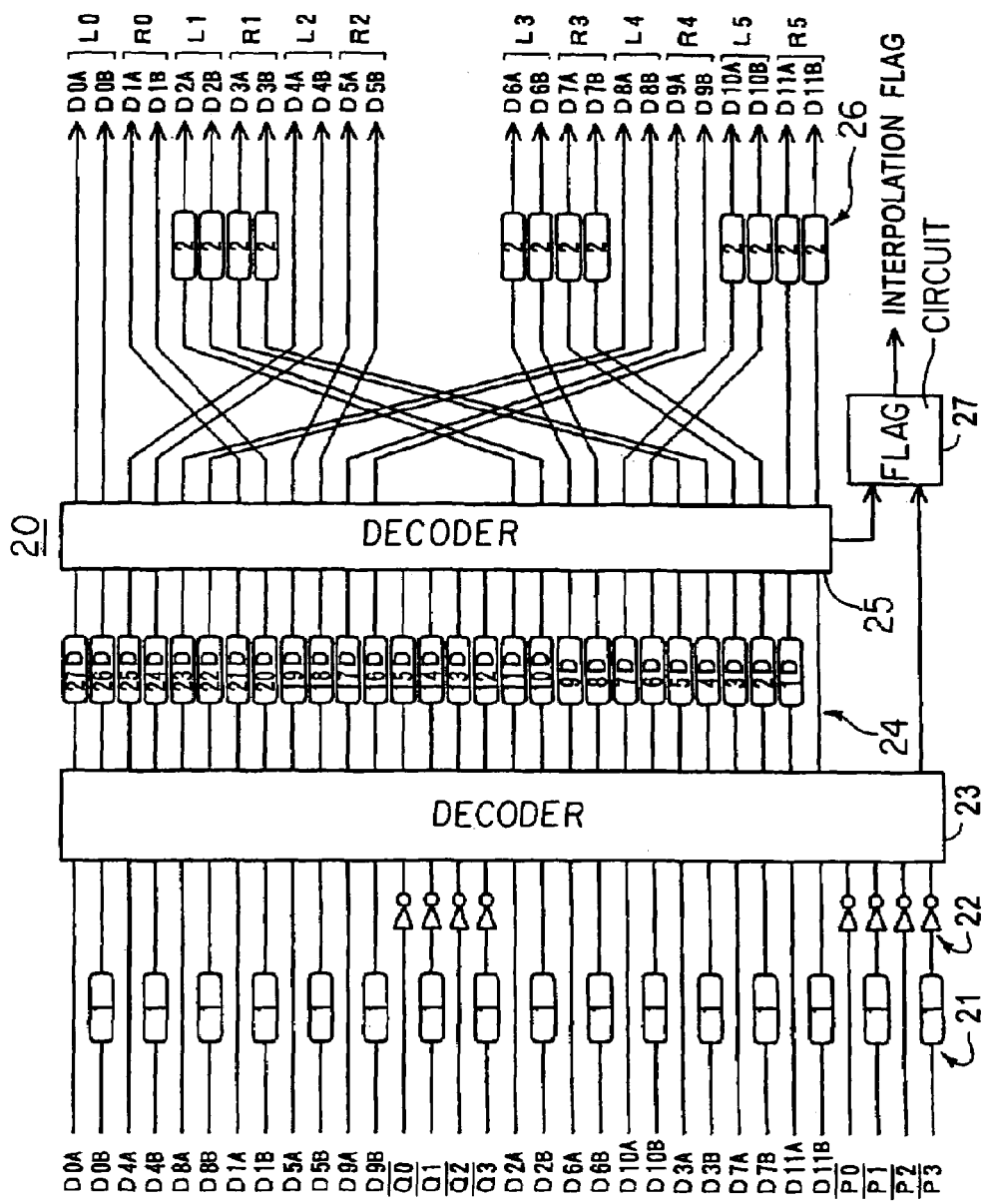
FIG. 2 is a system diagram illustrating the present invention.

FIG. 2 shows a CIRC decoder circuit 20 used in a playback system, in which the CIRC decoder circuit 20 is formed complementary to the CIRC encoder circuit 10. That is, from the EFM modulation signal which is reproduced from the CD, the original data sequence (encoded signal) is demodulated by an EFM demodulation circuit. This encoded signal is supplied to a delay circuit 21, whereby the symbol which is not delayed by the delay circuit 15 of the encoder circuit 10 is delayed by one symbol, thereby relatively canceling the delay by the delay circuit 15. Furthermore, at an inverter circuit 22, the inversion by the inverter circuit 16 of the encoder circuit 10 is reversed to retrieve the encoded output of the C1 encoder circuit 14.

This encoded output is decoded into the original symbol by a C1 decoder circuit 23, and thereafter, the symbol is supplied to a deinterleave circuit 24. At this deinterleave circuit 24, a delay of 27D, 26D, . . . , D, 0, which differ equally, is supplied to each symbol, thereby relatively canceling the delay of the symbol caused by the interleave circuit 13 of the encoder circuit 10. At this time, D=4 frames.

Then, the output of the deinterleave circuit 24 is decoded into the original symbol by a C2 decoder circuit 25, and thereafter, it is supplied to a delay/descramble circuit 26, whereby all the symbols are descrambled. Also, the symbol of an odd-numbered sample is delayed by two symbols, and the original digital audio data L0 to R5 (D0A to D11B) is retrieved. The above processing is performed for each frame, the original digital audio data is continuously extracted, and this digital audio data is converted from digital to analog form, forming the original analog audio signals of the left and right channels.

At this time, an error flag is retrieved from the C1 decoder circuit 23 and the C2 decoder circuit 25 and supplied to an interpolation flag generation circuit 27, whereby an error interpolation flag is generated. By using this error interpolation flag, the data in which an error has occurred among the data L0 to R5 is interpolated by an interpolation process such as preholding or average value interpolation.

The foregoing represents encoding processing and decoding processing for error correction in the CIRC4 method, which is adopted in current CDs.

On the other hand, in a double-density CD format called a DCDC (Double Density CD) standard, a process called the CIRC7 method is adopted for error correction coding. An encoder circuit and a decoder circuit of the CIRC7 method are configured similarly to the encoder circuit 10 and the decoder circuit 20 of the above-described CIRC4 method. In the CIRC7 method, the delay at the interleave circuit 13 and the deinterleave circuit 24 is set at 7 frames. As mentioned above, in the CIRC4 method, the delay is 4 frames.

Therefore, according to the CIRC7 method, since the interleave length is set longer than that of the CIRC4 method, the correction performance with respect to a burst error, that is, an error which occurs continuously in the read data due to a fingerprint on the CD, damage to the CD, etc., increases.

In the manner described above, since the interleave length differs between the CIRC4 method and the CIRC7 method, a CD used for recording by the CIRC4 method cannot be decoded by a playback device of the CIRC7 method. Conversely, a CD used for recording by the CIRC7 method cannot be decoded by the playback device of the CIRC4 method.

② DSV of CD

Figure 3:
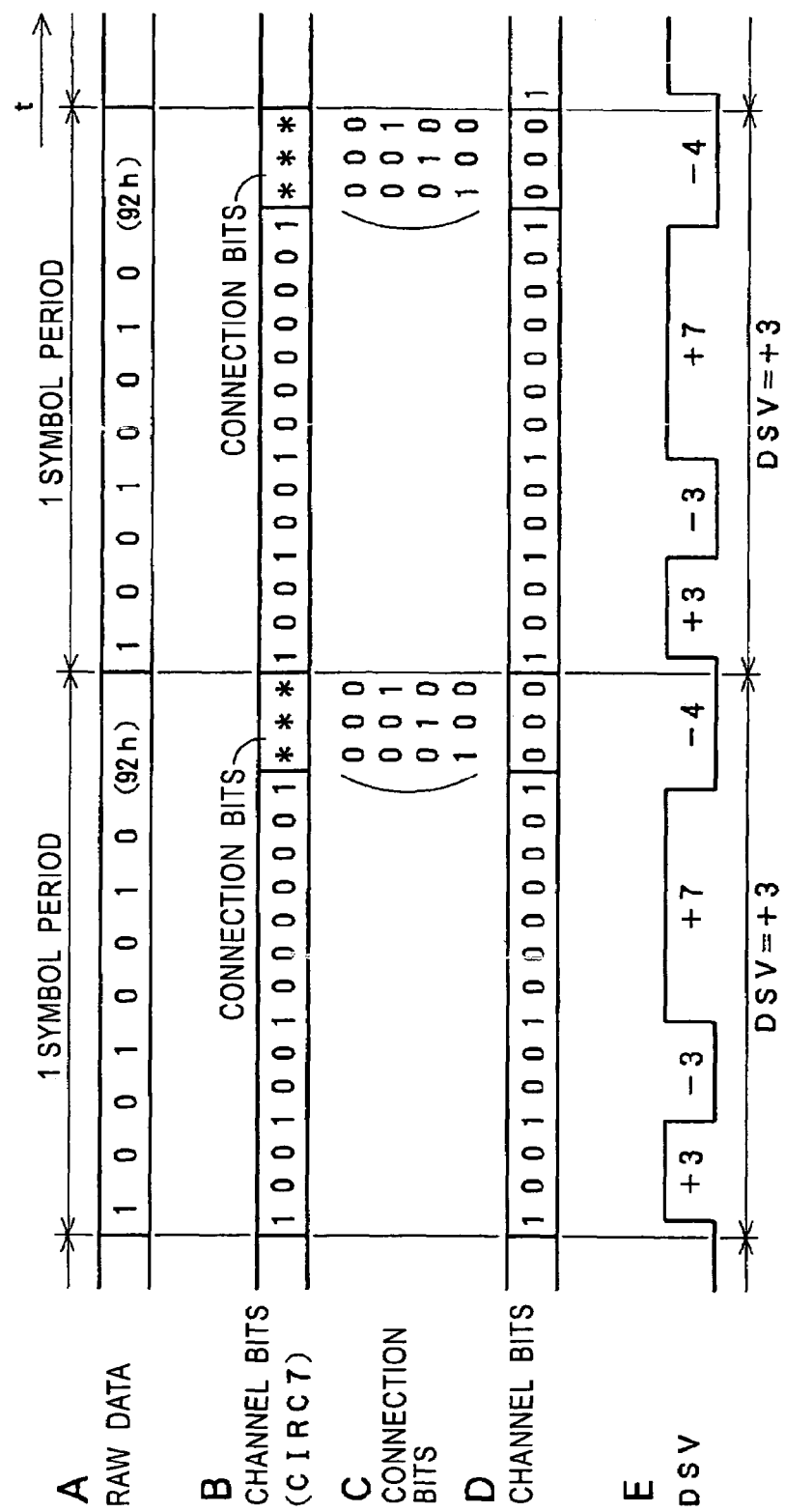
FIG. 3 is an illustration of the present invention.

As shown in FIG. 3A, when the value of a particular symbol (original data) is, for example, 92h (h indicates that the value is hexadecimal), and this symbol is subjected to an error correction coding process by using the CIRC7 method, that is, when this symbol is encoded so as to be converted into an EFM modulation signal, the channel bits (the EFM modulation signal) are arranged as shown in FIG. 3B by the conversion standard adopted by the CD. Furthermore, at this time, in the channel bits, three bits called connection bits or margin bits are inserted at every concatenation of the symbols.

These connection bits are inserted so that the minimum time width Tmin of the channel bits becomes longer and the maximum time width Tmax becomes shorter even at the concatenation of the symbols. More specifically, the connection bits are inserted so that two or more of "0" or "1" continue and 12 or more do not continue. Therefore, for the connection bits, one of four types of bit patterns of "000", "001", "010", and "100", shown in FIG. 3C, is selected. In the case shown in FIG. 3B, "000" is selected on the basis of the above-described conditions.

Therefore, the channel bits are arranged in the bit pattern shown in FIG. 3D. At this time, when the DSV (Digital Sum Value), which is a sum value of the DC components per unit time, is determined, this is as shown in FIG. 3E, and when one symbol ends, the DSV increases by 3. When the symbol is ordinary digital audio data, the polarity and the magnitude of the DSV per symbol vary, and the connection bits are selected from four types of bit patterns so that the connection bits are converged to 0 when the DSV is selected. Therefore, the sum value of the DSV always falls in a predetermined range close to 0.

However, when, for example, 92h is repeated as a symbol by a particular method, the sum value of the DSV increases by 3 for each symbol. When the DSV increases (or decreases) in this manner and falls outside a particular range, an influence is exerted on asymmetry correction in a playback circuit for a CD, and eventually, normal playback of the CD cannot be performed.

③ Case Where Item ② is Applied to Item ①

As described in item ①, since the interleave length differs between the CIRC4 method and the CIRC7 method, the encoded results differ, and the bit patterns of the EFM modulation signal differ. Therefore, a data sequence can be provided in which, when an error correction coding process, that is, encoding, is performed by the CIRC7 method, the DSV falls within a range in which normal playback is possible, and when an error correction coding process, that is, encoding, is performed by the CIRC7 method, the DSV does not fall within a range in which normal playback is possible.

An optical disc as a recording medium on which such a data sequence is recorded can be played back normally when it is played back by a playback device that uses the CIRC7 method without changing the method. However, when data which is read from the optical disc using a recording device that uses the CIRC4 method is copied onto a CD-R, in that recording device, the data sequence played back from the optical disc, which is the recording source, is encoded by the CIRC4 method and is recorded on a CD-R, which is a recording target. As a result, when the CD-R on which the data is copied is played back, the DSV is offset, and the data recorded on the CD-R cannot be played back normally.

A data sequence such that, although no abnormality occurs in the DSV in this manner when the data sequence is decoded and played back by the CIRC7 method, when the playback output is further encoded by the CIRC4 method and recorded, the DSV is offset, and an error occurs during playback, is called "special data".

Figure 4:
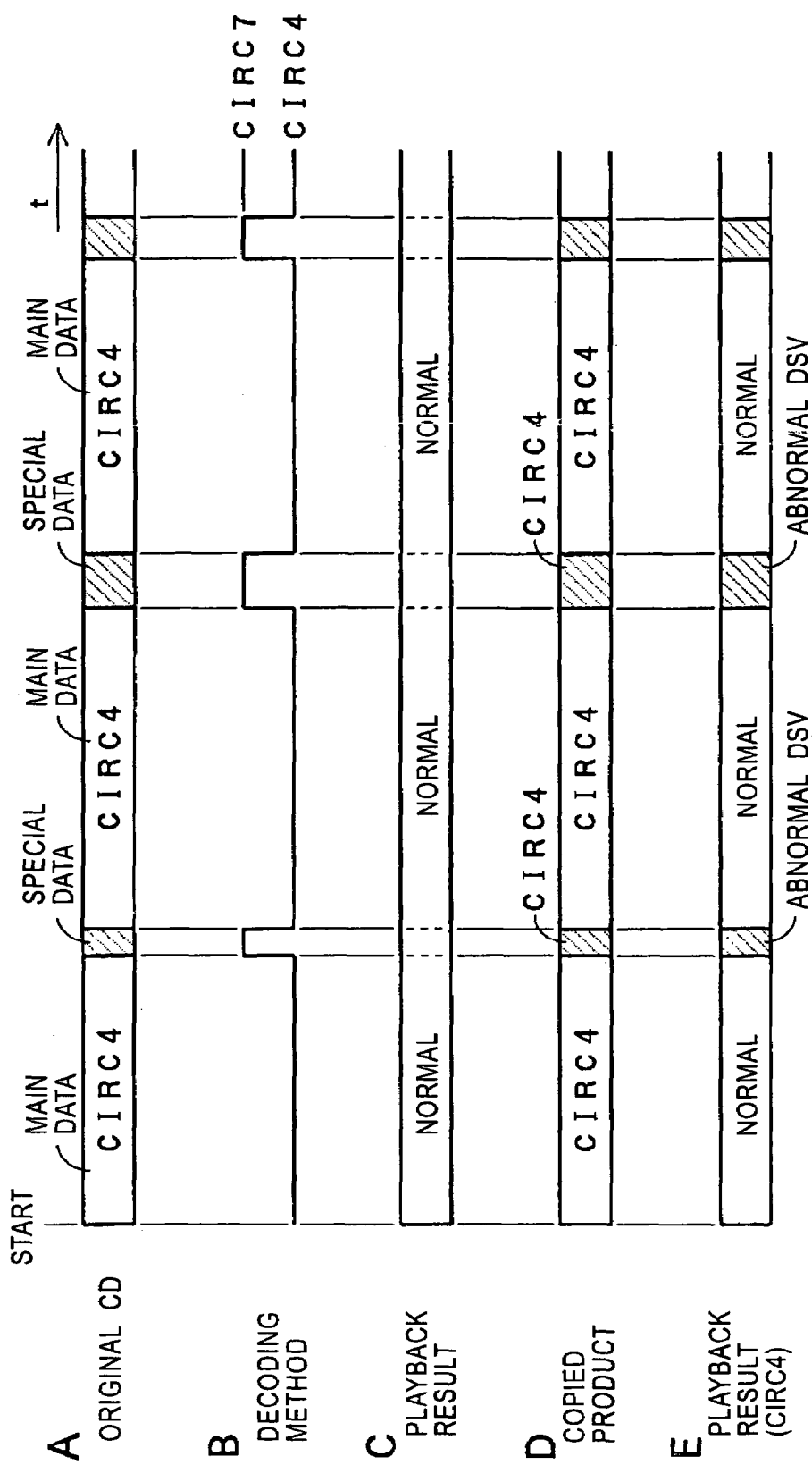
FIG. 4 is an illustration of the present invention.

④ Outline of the Present Invention FIGS. 4A and 4D show tracks of a CD in a developed manner. As shown in FIG. 4A, in the original CD, main data such as musical pieces is encoded by the CIRC4 method and recorded, and in a predetermined area indicated by oblique lines, special data described in item ③ is recorded. For example, in subcode data, information on the recording area (at the positions of the oblique-line portions) of the special data is contained. It is assumed that the standards of the signal recording format, and the size and the characteristics of the disc comply with those of current CDs.

Then, as shown in FIG. 4B, in a case where the recording area of the main data of the CD is played back by the CIRC4 method, since the main data is recorded by the CIRC4 method, the main data is played back normally, as shown in FIG. 4C.

Furthermore, the special data is recorded in the area of the oblique-line portions. Since the position at which this special data is recorded is known from the subcode data, when, as shown in, for example, FIG. 4B, a portion where the special data is recorded is to be played back, if the portion where the special data is recorded is played back by changing the decoding method to the CIRC7 method, the data which is recorded normally in the CD can be played back without the DSV being broken, that is, without an error occurring.

On the other hand, in a case where data recorded on a CD of FIG. 4A is to be copied onto a CD-R disc, etc., using a personal computer, etc., even if the recording area of the special data can be played back normally by switching between the decoding methods by the CIRC4 method and the CIRC7 method in the manner described above, all the played-back data is recorded on the CD-R disc, as shown in FIG. 4D. Therefore, when the CD-R disc is played back, as shown in FIG. 4E, the DSV becomes abnormal in the portion where the special data is recorded, and the subsequent playback of the CD-R disc cannot be performed. That is, practically, the copied data cannot be played back.

The foregoing is an outline of the method for practically invalidating copied data in the present invention. Furthermore, even if the appearance of the original CD and the copied CD is the same, in the recording area of the oblique lines in FIG. 4, the error correction method, that is, the data encoding method, differs, and therefore, this enables the original CD to be distinguished from the disc in which data is copied from the original CD.

⑤ An Example of Recording Device

Figure 5:
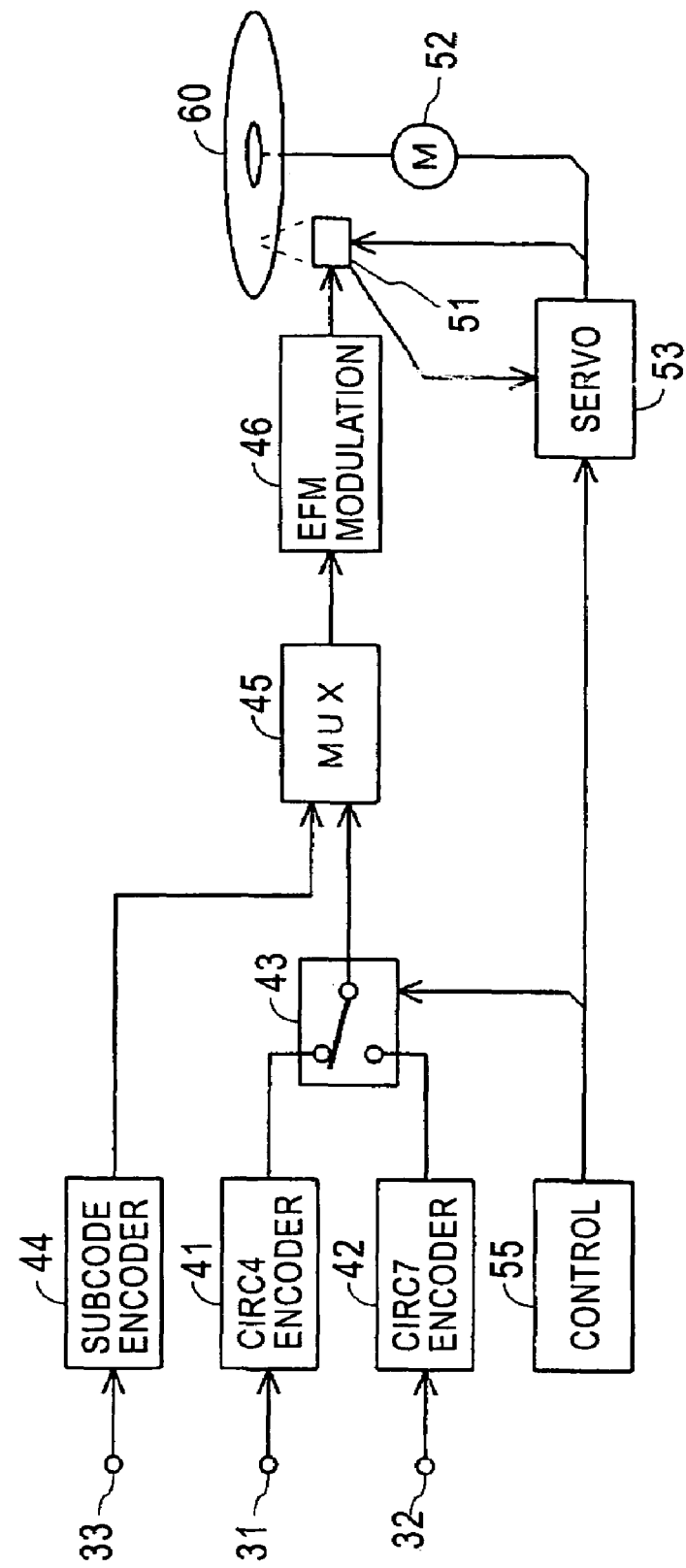
FIG. 5 is a system diagram showing an embodiment of the present invention.

FIG. 5 shows an example of a recording device to which the above-described items ① to ④ are applied. More specifically, main data, such as digital audio data, is supplied to a terminal 31, and special data, for example, data in which a value 92h is repeated, is supplied to a terminal 32. Furthermore, data serving as subcode data is supplied to a terminal 33.

The main data supplied from the terminal 31 is supplied to a CIRC4 encoder circuit 41, whereby an error correction coding process, that is, an encoding process, is performed thereon by the CIRC4 method, and the resulting encoded data sequence is supplied to a switching circuit 43. The special data supplied from the terminal 32 is supplied to a CIRC7 encoder circuit 42, whereby an error correction coding process, that is, an encoding process, is performed thereon by the CIRC7 method, and the resulting encoded data sequence is supplied to a switching circuit 43.

Furthermore, a signal indicating the position of the portion where the special data is recorded (for example, the oblique-line portions in FIG. 4A), that is, an address signal, is extracted from a system control circuit 55, and this address signal is supplied to the switching circuit 43 as a control signal therefor. As a result, from the switching circuit 43, a data sequence in which the main data is encoded and a data sequence in which the special data is encoded are extracted so as to establish a positional relationship such as that shown in, for example, FIG. 4A, and the output data from the switching circuit 43 is supplied to a multiplexer circuit 45.

The data which to be used as the subcode data, supplied from the terminal 33, is supplied to a subcode encoder circuit 44, whereby the subcode data is generated, and this subcode data is supplied to the multiplexer circuit 45. As described in item ④, the subcode data contains a signal indicating the position at which the special data is recorded, that is, an address signal or address information.

In this manner, encoded data, in which the data sequence of the special data is contained and the subcode data is added, is extracted as output data from the multiplexer circuit 45. This output data is supplied to an EFM modulation circuit 46, whereby the data is made to be an EFM modulation signal (channel bits). This EFM modulation signal is supplied to an optical recording head 51, whereby the EFM modulation signal is recorded in the form of spiral tracks on a recordable optical disc, for example, a CD-R disc (or a master disc of a CD) 60. At this time, the optical disc 60 is rotated at a predetermined linear velocity by a spindle motor 52, and also, servo control, which is necessary for various kinds of recording, such as tracking servo and focus servo, is performed on the optical disc 60 by a servo circuit 53.

In the above-described way, recording onto the optical disc 60 is performed. Therefore, on the optical disc 60, as described with reference to item ④ and, for example, FIG. 4A, the main data and the special data are recorded. The signal indicating the position at which the special data is recorded is contained in the subcode data.

⑥ An Example of Playback Device

Figure 6:
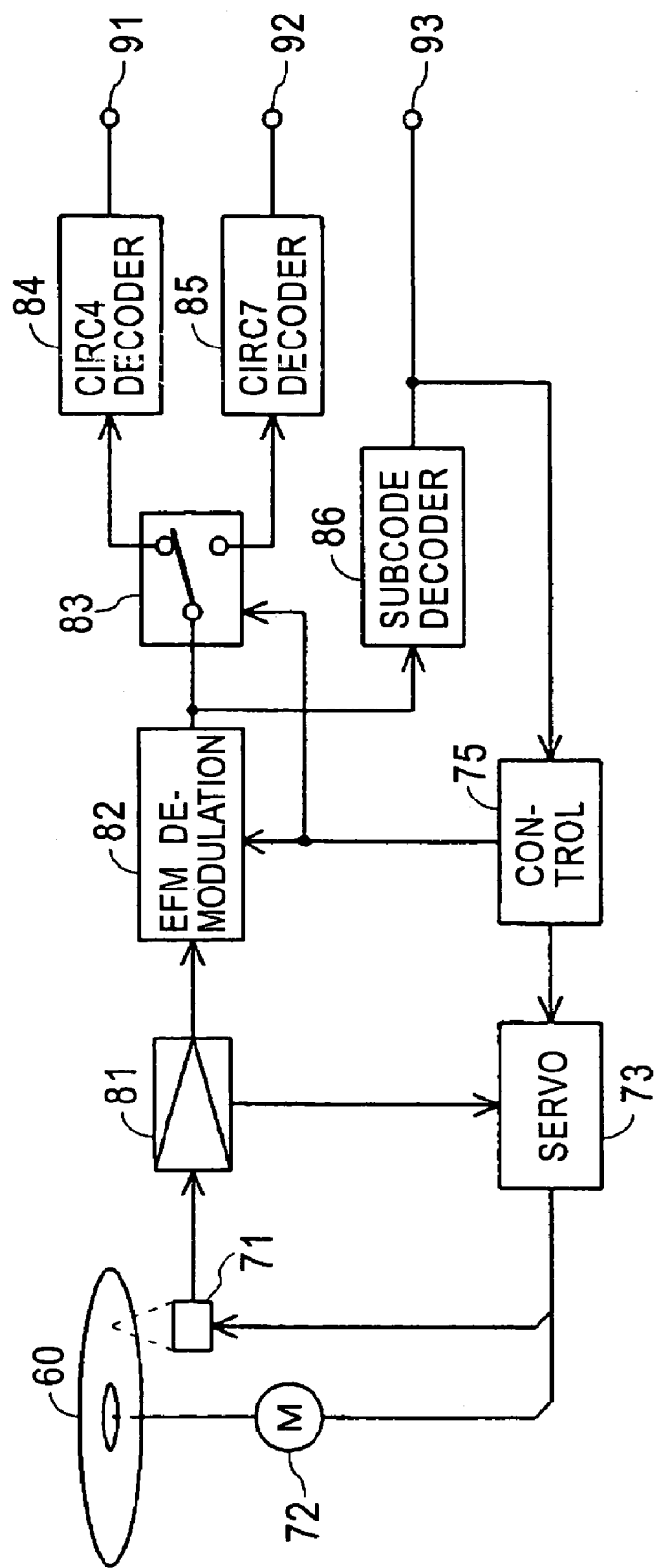
FIG. 6 is a system diagram showing an embodiment of the present invention.

FIG. 6 shows an example of a playback device for playing back an optical disc, which is produced and recorded by the recording device of item ⑤. More specifically, data is read by an optical playback head 71 from the optical disc (or a CD produced by using this as a master disc) 60, which is produced and recorded with reference to item ⑤. At this time, the optical disc 60 is rotated at a predetermined linear velocity by a spindle motor 72, and also, servo control, which is necessary for various kinds of recording, such as tracking servo and focus servo, is performed on the optical disc 60 by a servo circuit 73.

The output signal from the optical head 71 is supplied through an amplifier 81 to an EFM demodulation circuit 82, whereby the original data sequence (CIRC signal) is demodulated. The data sequence supplied from the EFM demodulation circuit 82 is supplied to a subcode decoder circuit 86, whereby the subcode data is decoded, and this subcode data is extracted at a terminal 93 and supplied to a system control circuit 75.

At the control circuit 75, a signal indicating the position of the portion where the special data is recorded (the position of the oblique-line portion in FIG. 4A) is extracted from the supplied subcode data, and a switching circuit 83 is controlled in accordance with this signal indicating the position. That is, the switching circuit 83 is connected to a terminal 83a of the switching circuit 83 when the playback of the main data is being performed and is connected to a terminal 83b of the switching circuit 83 when the playback of the special data is being performed, as shown in FIG. 6.

In this manner, the data sequence, in which the main data is demodulated, among the data sequence demodulated by the EFM demodulation circuit 82, is supplied through the switching circuit 83 to a CIRC4 decoder circuit 84, whereby the data sequence is decoded by the CIRC4 method. Therefore, the original main data is decoded, and this main data is extracted at a terminal 91. The data sequence demodulated from the special data, among the data sequence demodulated by the EFM demodulation circuit 82, is supplied through the switching circuit 83 to a CIRC7 decoder circuit 85, whereby the data sequence is decoded by the CIRC7 method, and the data is extracted at a terminal 92.

In the manner described above, when the main data is being played back, the EFM-demodulated data sequence is supplied to the CIRC4 decoder circuit 84 of the CIRC4 method, and when the special data is being played back, the EFM-demodulated data sequence is supplied to the CIRC7 decoder circuit 85 of the CIRC7 method. Therefore, normal playback of the optical disc 60 can be performed without the DSV being broken, that is, without an error occurring.

In this manner, even if the main data and the special data are recorded as described with reference to item ④, the main data, for example, digital audio data of a musical piece, can be played back normally to listen to the music. In a case where the data recorded on the optical disc 60 is copied, the sum value of the DSV becomes an abnormal value during playback as described above, and the copied disc cannot be played back normally. Therefore, it is possible to practically prevent illegal copying.

⑦ Another Example of Recording Device

Figure 7:
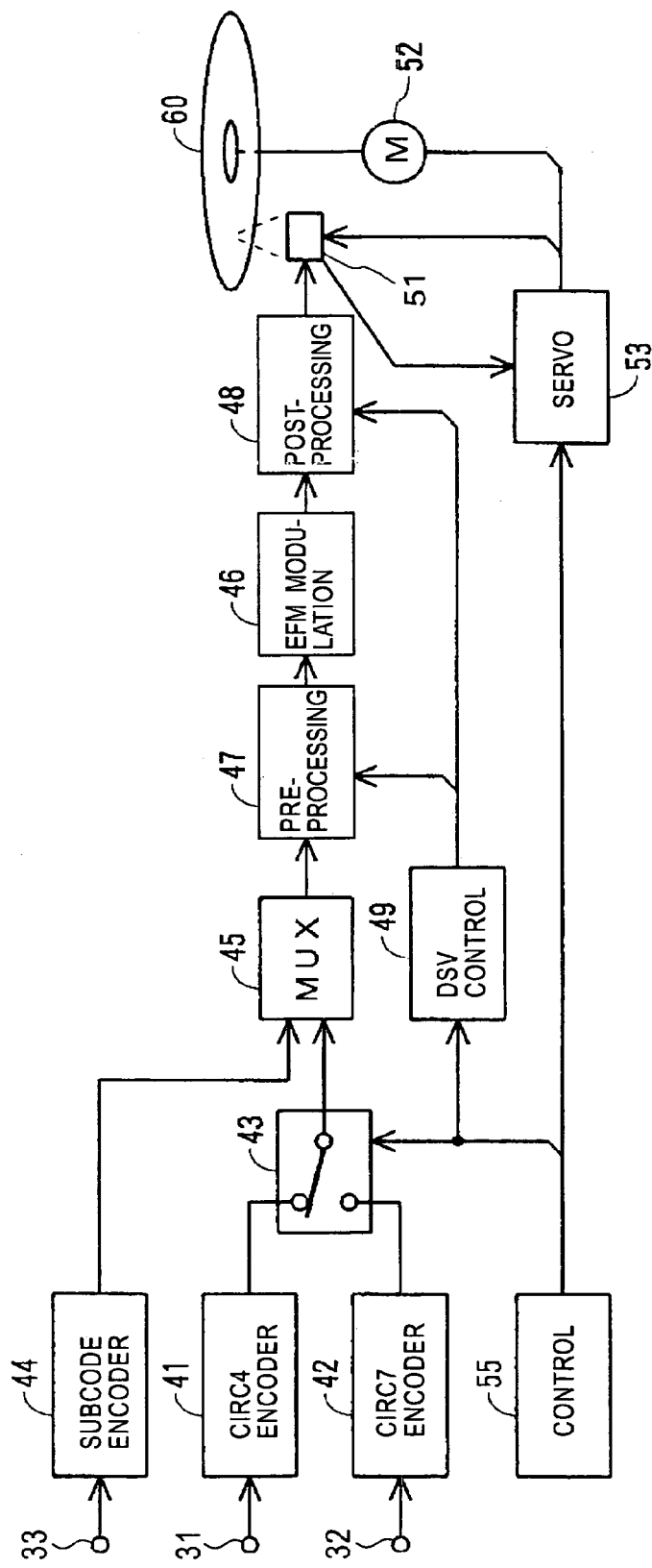
FIG. 7 is a system diagram showing another embodiment of the present invention.

FIG. 7 shows another example of the recording device, in which a pre-processing circuit 47 is provided at a stage prior to the EFM modulation circuit 46, and a post-processing circuit 48 is provided at a stage subsequent thereto. A signal indicating the position at which the special data is recorded is supplied from the control circuit 55 to the processing circuits 47 and 48, whereby another copy prevention process is performed. For example, in the processing circuits 47 and 48, processes, such as generation of bit patterns such that only two bits of "0" or "1" continue as the minimum time width Tmin, bit operation such that a parity error occurs, and shift of channel bits, are performed. In the playback device, processes complementary to those of the recording device are performed.

Therefore, the optical disc 60, which is produced and recorded by this recording device, has improved robustness against illegal copying.

⑧ Others

In the recording devices of FIGS. 5 and 7, the special data is supplied to the encoder circuit 42 of the CIRC7 method in order to form a data sequence in which the DSV is offset. Alternatively, the data sequence in which the DSV is offset may be provided in advance in a memory, etc., and the data sequence may be supplied to the switching circuit 43. In the foregoing, the main data is subjected to an error correction coding process by the CIRC4 method, and the special data is subjected to an error correction coding process by the CIRC7 method. Alternatively, the processes of the CIRC4 method and the CIRC7 method may be reversed.

Furthermore, in the case of two CIRC methods in which the interleave lengths differ, the present invention can be applied. Alternatively, in the foregoing, the CIRC (Cyclic Redundancy Check) method is adopted as an encoding process and a decoding process. Also, the present invention can be applied to a case in which a single error correction code such as CRC and Reed-Solomon code is used, an interleave process and a scrambling process are changed, and a generation polynomial is changed.

In place of the information indicating the position at which the special data is recorded, information indicating the recording area of the main data can also be contained in the subcode data, etc. Furthermore, although in the foregoing, the recording medium is a CD, it may be an MD (Mini Disc), a DVD (Digital Versatile Disc), etc. Alternatively, the information can also be transmitted and received via a network, such as the Internet. In the recording device of FIG. 7, only one of the processing circuits 47 and 48 may be used.

According to the present invention, in the case of an original CD, main data such as digital audio data can be played back or read normally, but a CD copied from the original CD cannot be played back or read normally due to the abnormality of the DSV. Therefore, it is possible to practically prevent illegal copying.

The invention claimed is:

1. A recording method, wherein, when a certain portion of main data is recorded by being encoded by a first encoding method and the other portions of the main data is recorded by being encoded by a second encoding method, an encoding process is performed by said first encoding method so that when data which is recorded in such a manner that the data encoded by said first encoding method is subsequently decoded by a decoding method corresponding to said first encoding method, and thereafter, is further encoded by said second encoding method and then decoded by a decoding method corresponding to said second encoding method, a sum value of DC components per unit time increases.

2. A recording method according to claim 1, wherein, when said main data of m bits is converted into a data symbol of n (m<n) bits by said first encoding method, connection bits such that the sum value of DC components per unit time are selected from among a plurality of connection bits, and the connection bits are added after said data symbol of m bits, the encoding process is performed in which said connection bits such that said sum value of DC components increases when a decoding process corresponding to said second encoding method is performed, are selected from said plurality of connection bits and are added.

3. A recording method according to claim 2, wherein said main data of m bits, which is encoded by said second encoding method, is converted into a data symbol of n (m<n) bits, connection bits such that the sum value of DC components per unit time decreases are selected from among a plurality of connection bits, and the connection bits are added after said data symbol of m bits.

4. A recording method according to claim 3, wherein, in said first encoding method, an error correction coding process is performed on said main data in accordance with a first error correction code, and in said second encoding method, an error correction coding process is performed on said main data in accordance with a second error correction code.

5. A recording method according to claim 1, further comprising a step of recording data indicating a position at which the data encoded by said first encoding method is recorded.

6. A recording device comprising:

a first encoding processing section for encoding a certain portion of main data by a first encoding method;

a second encoding processing section for encoding the other portions of said main data by a second encoding method;

a modulation processing section for performing a modulation process so that, when data which is recorded in such a manner that output data from said first encoding processing section is decoded by a decoding method corresponding to said first encoding method; and thereafter, is further encoded by said second encoding method and then decoded by a decoding method corresponding to said second encoding method, a sum value of DC components per unit time increases; and a recording section for recording output data from said modulation processing section on a recording medium.

7. A recording device according to claim 6, wherein said modulation processing section performs a process, on output data of said first coding processing section, in which, when said main data of m bits is converted into a data symbol of n (m<n) bits, connection bits such that the sum value of DC components per unit time decreases are selected from among a plurality of connection bits, and the connection bits are added after said data symbol of m bits, said connection bits such that said sum value of DC components increases when a decoding process corresponding to said second encoding method is performed are selected from said plurality of connection bits and are added.

8. A recording device according to claim 6, wherein said first encoding processing section performs an error correction coding process on said main data in accordance with a first error correction code, and said second encoding processing section performs an error correction coding process on said main data in accordance with a second error correction code.

9. A recording device according to claim 6, wherein said modulation processing section performs a process, on output data from said second coding processing section, in which data of m bits is converted into a data symbol of n (m<n) bits, connection bits such that the sum value of DC components per unit time decreases are selected from among a plurality of connection bits, and the connection bits are added after said data symbol of m bits.

10. A recording device according to claim 6, further comprising a selection section for selectively supplying output data from said first coding processing section and output data from said second coding processing section to said modulation processing section.

11. A recording device according to claim 6, wherein data is further recorded indicating the position at which the data encoded by said first encoding method is recorded.

12. A playback method for playing back data which is read from a recording medium while switching between a first decoding process for performing a decoding process by a first decoding method corresponding to a first encoding method and a second decoding process for performing a decoding process by a second decoding method corresponding to a second encoding method, in which, when a certain portion of main data is recorded using a first encoding method and the other portions of the main data are recorded using a second encoding method, an encoding process is performed by the first encoding method so that, when data which is recorded in such a manner that the data encoded by said first encoding method is subsequently decoded by a decoding method corresponding to said first encoding method and thereafter, is further encoded by said second encoding method and then decoded by a decoding method corresponding to said second encoding method, a sum value of DC components per unit time increases.

13. A playback method according to claim 12, wherein, in said recording medium, data is recorded indicating the position at which the data encoded by said first encoding method is recorded, and in said method, said first decoding process and said second decoding process are switched in accordance with the information indicating said position.

14. A playback device comprising:
a head section for reading data from a recording medium, in which, when a certain portion of main data is recorded with a first encoding method and the other portions of the main data is recorded with a second encoding method, an encoding process is performed by said first encoding method so that, when data which is recorded in such a manner that the data encoded by said first encoding method is subsequently decoded by a decoding method corresponding to said first encoding method and thereafter, is further encoded by said second encoding method, and then decoded by a decoding method corresponding to said second encoding method, a sum value of DC components per unit time increases;
a first decoding processing section for performing a decoding process on an output signal, supplied from the head section, by the first decoding method corresponding to said first encoding method;
a second decoding processing section for performing a decoding process on an output signal, supplied from the head section, by the second decoding method corresponding to said second encoding method; and
a control section for selectively supplying the output signal from said head section to said first decoding processing section and said second decoding processing section.

15. A playback device according to claim 14, wherein, in said recording medium, data is recorded indicating the position at which the data encoded by said first encoding method is recorded, and said control section selectively supplies the output signal from said head section to said first decoding processing section and said second decoding processing section on the basis of the information indicating said position.

16. A playback device according to claim 15, further comprising a demodulation processing section for performing a demodulation process on an output signal supplied from said magnetic head section and outputting output data to said first decoding processing section or said second decoding processing section.

17. A playback device according to claim 16, wherein said first decoding processing section performs an error correction process on the output data supplied from said demodulation processing section in accordance with a first error correction code, and said second decoding processing section performs an error correction process on the output data supplied from said demodulation processing section in accordance with a second error correction code.

18. A recording medium, in which a certain portion of main data is recorded by being encoded by a first encoding method and the other portions of the main data is recorded by being encoded by a second encoding method, and when data which is recorded in such a manner that the data encoded by said first encoding method is subsequently decoded by a decoding method corresponding to said first encoding method and thereafter, is further encoded by said second encoding method and then decoded by a decoding method corresponding to said second encoding method, a sum value of DC components per unit time increases.

19. A recording medium according to claim 18, wherein, when said main data of m bits is converted into a data symbol of n (m<n) bits by said first encoding method, connection bits such that the sum value of DC components per unit time decreases are selected from among a plurality of connection bits, and the connection bits are added after said data symbol of m bits, data is recorded in which said connection bits such that said sum value of DC components increases when a decoding process corresponding to said second encoding method is performed are selected from among said plurality of connection bits and are added.

20. A recording medium according to claim 19, wherein data is recorded on said recording medium, said data being such that said main data of m bits, which is encoded by said second encoding method, is converted into a data symbol of n (m<n) bits, connection bits such that the sum value of DC components per unit time decreases are selected from among a plurality of connection bits, and the connection bits are added after said data symbol of m bits.

21. A recording medium according to claim 18, wherein, in said first encoding method, an error correction coding process is performed on said main data in accordance with a first error correction code, and in said second encoding method, an error correction coding process is performed on said main data in accordance with a second error correction code.

22. A recording medium according to claim 18, wherein data indicating a position at which the data encoded by said first encoding method is further recorded on said recording medium.

* * * * *